United States Patent
Zhang et al.

(10) Patent No.: US 10,277,246 B2
(45) Date of Patent: Apr. 30, 2019

(54) PROGRAM COUNTER COMPRESSION METHOD AND HARDWARE CIRCUIT THEREOF

(71) Applicant: HeFei University of Technology, HeFei, Anhui (CN)

(72) Inventors: Duoli Zhang, HeFei (CN); Bin Zhang, HeFei (CN); Yukun Song, HeFei (CN); Can Wei, HeFei (CN)

(73) Assignee: HEFEI UNIVERSITY OF TECHNOLOGY, Hefei, Anhui (CN)

( * ) Notice: Subject to any disclaimer, the term of this patent is extended or adjusted under 35 U.S.C. 154(b) by 0 days.

(21) Appl. No.: 15/579,827

(22) PCT Filed: Feb. 17, 2017

(86) PCT No.: PCT/CN2017/073927
§ 371 (c)(1),
(2) Date: Dec. 5, 2017

(87) PCT Pub. No.: WO2018/107579
PCT Pub. Date: Jun. 21, 2018

(65) Prior Publication Data
US 2019/0089370 A1 Mar. 21, 2019

(30) Foreign Application Priority Data
Dec. 13, 2016 (CN) .......................... 2016 1 1143794

(51) Int. Cl.
*G06F 11/36* (2006.01)
*H03M 7/30* (2006.01)
(52) U.S. Cl.
CPC ....... *H03M 7/3088* (2013.01); *G06F 11/3636* (2013.01); *G06F 11/3692* (2013.01)
(58) Field of Classification Search
None
See application file for complete search history.

(56) References Cited

U.S. PATENT DOCUMENTS 6,907,598 B2   6/2005   Fraser
9,294,124 B2   3/2016   Li
(Continued)

FOREIGN PATENT DOCUMENTS

| CN | 101118486 A | 2/2008 |
| CN | 101517530 A | 8/2009 |
| CN | 101739338 A | 6/2010 |

*Primary Examiner* — Howard Williams
(74) *Attorney, Agent, or Firm* — Birch, Stewart, Kolasch & Birch, LLP

(57) ABSTRACT

The present invention provides a program counter compression method and a hardware circuit thereof. The compression method of the present invention includes the following steps: step (1), acquiring execution condition of instructions sent by a processor and classifying and screening said instructions based on said execution condition of the instructions; step (2), executing differential operation on instruction count values of the objective classification and the stall periods based on the classifying and screening result and splicing the obtained differential values; step (3), dictionary encoding the valid differential slicing data segments recorded in step (2). The present invention effectively combines the architecture compression and non-architecture compression and proposes a three-stage compression scheme by organizing and applying classifying and screening, differential encoding and dictionary compression, which drastically increases the compression ratio of the program counter.

5 Claims, 3 Drawing Sheets

(56) References Cited

U.S. PATENT DOCUMENTS

| | | |
|---|---|---|
| 2006/0132822 A1 | 6/2006 | Walmsley |
| 2008/0005544 A1 | 1/2008 | Jourdan et al. |
| 2008/0082801 A1 | 4/2008 | Edgar et al. |
| 2009/0037704 A1* | 2/2009 | Thekkath ............ G06F 11/3636 712/227 |
| 2014/0068229 A1* | 3/2014 | Krishnannoorthy ......................... G06F 9/30156 712/208 |
| 2015/0326247 A1 | 11/2015 | Li |

* cited by examiner

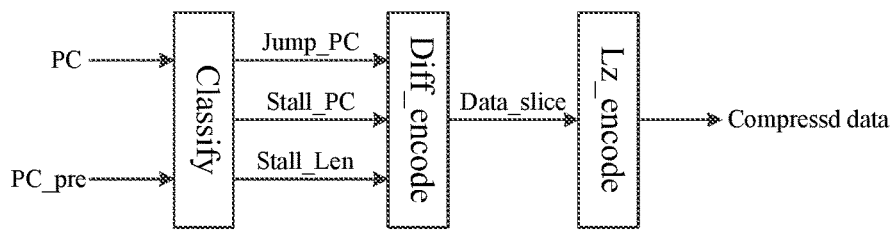
Fig. 1
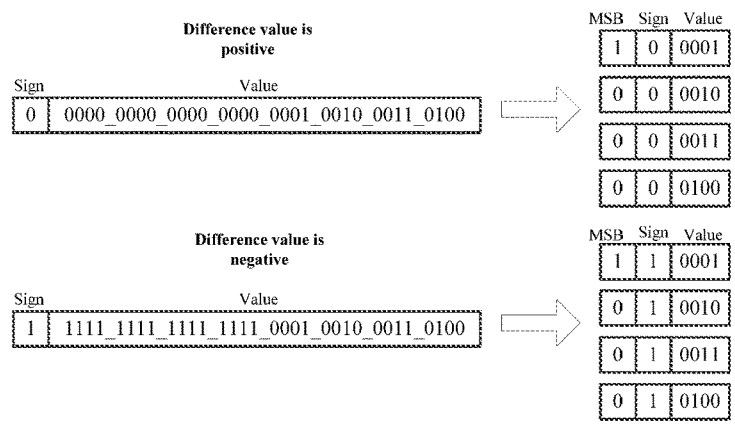
Fig. 2
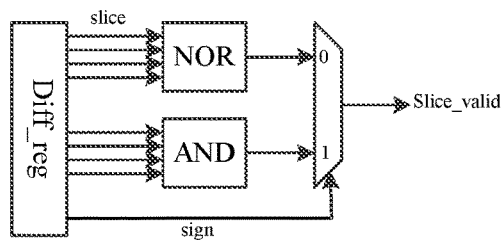
Fig.3
Fig. 4

PROGRAM COUNTER COMPRESSION METHOD AND HARDWARE CIRCUIT THEREOF

RELATED APPLICATION

The present application claims the priority of China Invention Patent application No. 201611143794.2, titled "Program Counter Compression Method and Hardware Circuit Thereof" filed on Dec. 13, 2016.

FIELD OF THE INVENTION

The present invention relates to the field of electronic circuit, particularly to a program counter compression method and a hardware circuit thereof.

BACKGROUND

With the increasement of complexity of software executed in processors, software debugging and implementation effect of analysis software become more and more important and collecting path information of program execution is of important significance. There are two common path information collection methods. The first is to simulate and execute a program by a simulator, which is simple to implement, but the slow emulation speed affects the efficiency of information collection. The second is to embed a hardware module in the processor to record path information in real time, which has a fast speed of information collection, but the on-chip memory size and the data transmission bandwidth limits the amount of information to be recorded. In order to increase the efficiency of information collection, and reduce requirement on hardware conditions at the same time, an efficient program counter compression method is desired to reduce the amount of effective data to be recorded.

Since the program counter compression module is not a core component of the processor, its hardware resource consumption should be as small as possible, and its power consumption should be as low as possible in order not to influence the overall area and performance of the processor. Therefore, exploring an efficient program counter compression scheme and a hardware circuit thereof to increase compression ratio of the program counter and reduce resource consumption and power consumption of the hardware module has important research value.

Existing program counter compression methods are proposed mainly based on two points of view/angle. The first is the compression based on architecture, for example, only records jump instruction information in the execution of program and does not process sequence instruction information. The second is a common loseless data compression method such as differential encoding and dictionary coding. Most prior art technologies have not combined the two angle effectively and the compression effect is still to be improved. In the aspect of architecture compression, existing research paied less attention to obstruction instructions, which impacts compression effect in some particular fields. Dictionary coding has been widely applied in the compression of program counter. However, most hardware implementation methods for dictionary coding proposed in existed research require much hardware resource, particularly more registers, and require large power consumption at the same time, which limits the practical application of this method.

SUMMARY

In view of the above problem, the present invention proposes a new program counter compression method and a corresponding hardware implementation circuit or a compression device.

Specifically, in one aspect, the present invention proposes a program counter compression method characterized in that said compression method includes steps of:

step (1), acquiring execution condition of instructions sent by a processor and classifying and screening said instructions based on said execution condition of the instructions;

step (2), execute differential operation on the values of the program counter of objective type of instructions and stall periods based on a result of classifying and screening, then slicing the obtained difference values to obtain respective valid data segment; and Step (3), dictionary encoding the valid data segments of difference slices obtained in step (2).

Preferably, said program counter compression method classifies instructions into (1) sequential execution, (2) skip and (3) stall, said step (1) includes:

step (1.1), acquiring a program counter value corresponding to each instruction;

step (1.2), calculating a difference value $PC\_diff=PC-PC\_pre$ of program counter values of any two successive instructions, wherein PC denotes the value of program counter of the current period, PC_pre denotes the value of program counter of the last period (i.e., previous period);

step (1.3), classifying the instructions based on the difference value PC_diff of the program counter values of any two successive instructions, (a) if $PC\_diff=1$, classifying the current instruction as sequence instruction and not recording the instruction;

(b) If $PC\_diff=0$, classifying the current instruction as stall instruction and recording the program counter value corresponding to the stall instruction and stalled periods;

(c) If $PC\_diff\neq 0$ and $PC\_diff\neq 1$, classifying the current instruction as jump instruction, recording a branch address corresponding to the instruction and a program counter value corresponding to a destination address.

Preferably, said step (2) includes:

step (2.1), differentiating the program counter values of the recorded stall instruction and jump instruction and the number of periods for which respective instruction persists, so as to obtain respective difference values;

step (2.2), dividing the differential values into several data segments according to the sequence of data bits with each data segment having the same number of data bits;

step (2.3), determining from left to right whether data bits in each data segment are all 0 or all 1;

step (2.4), if data bits in a data segment are all 0 or all 1, discarding the data segment, or else, if data bits in the data segment are not all 0 or all 1, transferring the data segment and its lower data segments to step (3).

Preferably, said step (3) includes:

step (3.1), receiving data segments transferring in step (2), wherein each data segment contains several source data;

step (3.2), constructing a dictionary in a memory, the dictionary comprising several elements;

step (3.3), searching each of the source data in each element of the dictionary, if the current source data matches an element in the dictionary, recording the position of the element in the dictionary and updating the dictionary with the source data; if all elements are not matched, updating the dictionary with the source data directly, wherein while updating the dictionary, the dictionary does not slide, and elements in the dictionary are covered from left to right with the source data, and the search starting position is incremented by +1 after each updating.

Preferably, said step (3) further includes:

partitioning a dictionary window; reading N data sources one time, with N being a positive integer greater than or equal to 2, for each data source, searching for one data source is started for each program period, and the search starting location for each data source is incremented by +1 as compated to the last data source; so as to obtain a matched search result for each data source, and determine a practical matching result based on a matched result for all the N data sources.

On the other hand, the present invention proposes a program counter compression device, characterized in that said compression device includes:

an instruction classification module, a data differential slicing module and a dictionary encoding module, said instruction classification module is configured to acquire execution condition of instructions sent by a processor and classifying and screening said instructions based on said execution condition of the instructions;

said data differential slicing module is configured to execute differential operation on values of a program counter of objective type instructions and stall periods based on a result of classifying and screening, and slicing the obtained differential values;

said dictionary encoding module is configured to construct dictionary codes base on a RAM with a depth of N and LZ dictionary encoding valid differential sliced data segments.

Preferably, said compression device is configured to carry out said method.

The present invention is mainly applied in controlling component.

The present invention is mainly directed to the processor architecture of "microcontroller+coprocessor". Software programs are executed in microcontroller that transmits some control commands to the coprocessor according to the execution result. The coprocessor, as the main body of operation, receives configurations and accomplish specific operations. There are many stall instructions in software programs of the processor based on this architecture. If a certain instruction corresponds to transmitting an operation control command to the coprocessor, the next instruction will be a stall instruction. Instruction execution will stay in such instruction, until the operations in the coprocessor is accomplished, which guarantees that the coprocessor is scheduled in a unified way by the microcontroller and various operations are executed in order.

As compared to prior art research, the program counter compression scheme and the hardware circuit thereof of the present invention have the following advantages.

(1) The present invention effectively combines the architecture compression and non-architecture compression and proposes a three-stage compression scheme by organizing and applying classifying and screening, differential encoding and dictionary compression, which drastically increases the compression ratio of the program counter.

(2) In the classifying and screening step of the present invention, stall instructions are processed accordingly and the compression effect is especially good for the processor of "microcontroller+coprocessor" structure.

(3) In the differential encoding step of the present invention, by slicing the differential values, valid bit width of the differential values is reduced, and data bit width of slices is fixed, saving resources to subsequent dictionary encoding;

(4) The present invention proposed a hardware implementation structure for dictionary encoding which can significantly reduce the number of registers used, even uses no register, reducing resource and power consumption of the dictionary encoding hardware module.

BRIEF DESCRIPTION OF DRAWINGS

FIG. 1 is a schematic flow diagram of a program counter compression method;

FIG. 2 is a schematic diagram of differential slicing by the method of the present invention;

FIG. 3 is a hardware circuit for differential slicing according to the present invention;

FIG. 4 is an example of LZ (Lampel-Ziv) dictionary coding;

DETAILED DESCRIPTION OF EMBODIMENTS

Figure 5:
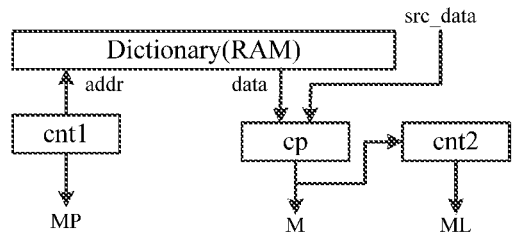
FIG. 5 is a structural diagram of dictionary compression hardware.

The present invention will be described in detail below with respect to accompanying drawings and embodiments thereof. However, the scope of the present invention will not be limited to the scope described in embodiments.

FIG. 1 is a flow chart of a three-stage compression scheme. PC_classify, Diff_encode and LZ_encode in FIG. 1 refer to three compression steps, namely classifying screening, differential slicing and dictionary coding, PC and PC_pre refer to the values of the program counter for the current period and the last period, Jump_PC and Stall_PC refer to values of program counter corresponding to jump instruction and stall instruction, stall_len refers to the number of stalled periods corresponding to the stall instruction, and Data_slice refers to valid data segment after differential slicing processing.

As shown in FIG. 1, the program counter compression method of the present invention is divided into 3 steps: (1) classifying screening, (2) differential slicing and (3) dictionary coding. The implementation process of the present embodiment will be described in detail below in terms of the three steps.

1. Classifying Screening

In the present invention, instructions in the processor GFP are classified into 3 types: (1) sequential execution, (2) skip and (3) stall. In on-line debugging design, it is possible to resolve the execution condition of instructions in GFP by simply recording values of program counter corresponding to the latter two kinds of instructions. The specific screening method is to solve difference of values of program counter between two successive instructions for classification. Specifically, assuming that PC represents the value of program counter for the current period, PC_pre represents the value of program counter for the last period, the differential value PC_diff=PC-PC_pre:

(1) if PC_diff=1: sequence instruction, not recorded;

(2) if PC_diff-=0: stall instruction, recording program counter value corresponding to the stall instruction and the stalled periods;

(3) if PC_diff≠0 and PC_diff≠1: skip type instructions, recording branch address and destination address.

The classifying and screening method adopted in the present invention fully considers that there are three instructions in the processor of "microcontroller+coprocessor" structure, namely sequence instruction, stall instruction and jump instruction, reduces valid data size to be recorded as much as possible. While most prior art technologies do not consider stall instruction, and have much improvement space in terms of compression ratio.

2. Differential Slicing

The program counter values of the two kinds of instructions and the number of periods for which stall instructions persist recorded in the first step are differential encoded. Assuming D1 and D2 are two valid data recorded successively in the classifying and screening step, the calculation formula for the differential value is: diff=D1−D2. The differential value "diff" is then subject to slicing. The specific method for slicing the differential value is to divide the differential value into several data segments according to the sequence of various data bits with each data segment having the same number of data bits. FIG. 2 is a diagram of differential slicing in which a 32-bit differential value is divided into 8 data segments each containing 4 data bits and 4 data segments corresponding to the lower 16 bits are valid data segments. As shown in FIG. 3, only when data bits of a certain data segment are not all 0s or 1s, the data segment is transferred to the next compression step (dictionary coding step). Here, the acceptation and rejection rule of data segments is as follows. Data segments are checked in turn from high bits to low bits. If all data bits in a data segment are 0 (positive) or 1 (negative), the next data segment is checked, otherwise from the present data segment till the lowest bit data segment are all valid data segments that need to be transferred to the next compression step. For example, a 32-bit differential value 0000-0000-0000-0000-0000_0011_0000_0000 contains 3 valid data segments 0011, 0000 and 0000.

As compared to classic differential encoding (differential valid field+bit width of differential value) method, it has mainly advantages in: (1) bit width of differential value not required, saving time and resources; (2) fixed bit width of differential slicing value, saving hardware resources for subsequent dictionary encoding. Dictionary encoding needs many comparators, and the bit width of comparator and the output bit width of differential encoding are the same, while the classic encoding methods need to support 32-bit valid bit width.

At present, in prior art, the slicing method of differential encoding has not been applied, and most are the expression method of differential valid field+differential value bit width. However, the inventor of the present application found out by research that applying the differential encoding slicing approach of the present invention can effectively reduce operation efforts and save hardware resources.

3. LZ Dictionary Encoding

Valid differential slice fields recorded in step 2 are subjet to LZ dictionary encoding.

(1) Principle of LZ Dictionary Encoding

LZ dictionary encoding is a classic nondestructive/loseless data condensation algorithm. Its main principle is to have a dynamically varying dictionary window in the process of encoding, and when reading a batch of data to be compressed that have a certain data segment identical to that in the dictionary, it is expressed by the starting location of the data segment and the matched length of the data. FIG. 4 is an example of LZ dictionary encoding adopted in prior art.

In FIG. 4, the left side 8 boxes constitute a sliding dictionary window (Dictionary), the middle 7 boxes represent the source data (Src) to be compressed, and the value of variable M represents the matching condition between the current source data and the dictionary, 1 represents successful matching, and 0 represents failure. Variables MP and ML represent the matching location and the matching length of the source data and the dictionary window. M, MP and ML vary in real time as the source data and dictionary vary. Here, it is assumed that the dictionary window contains 8 data buffer units, the initialization contents are 0, 1, 2 . . . 7, and the data to be compressed are 1, 2, 3, 4, 5, 6, 7. First, data 1 is matched to the dictionary content and the matching is successful with the matching location of 1. Then the dictionary content is updated by shifting data in the dictionary to the left by a buffer unit. Subsequently, it is found in turn that data 2 and 3 also match the data in buffer unit at location 1 in the dictionary, until 5 can not be matched successfully. The first set of compression result (1, 3, 5) of the dictionary encoding is output, with the matching location 1, the matching length 3 and the matching end data 5. The dictionary compression principle for latter source data is identical with this.

The present invention improves the LZ dictionary encoding principle, resulting in higher execution efficiency and larger compression ratio.

(2) Hardware Implementation Scheme for LZ Dictionary Encoding

As shown in FIG. 5, In the present embodiment, a RAM with depth N is used as the dictionary, the counter cnt1 generates the dictionary's address addr and the matching location MP, the counter cnt2 generates the matching length ML, and the comparator CP accomplishes the comparison matching operation in a plurality of periods to obtain the matching result M.

Figure 6:
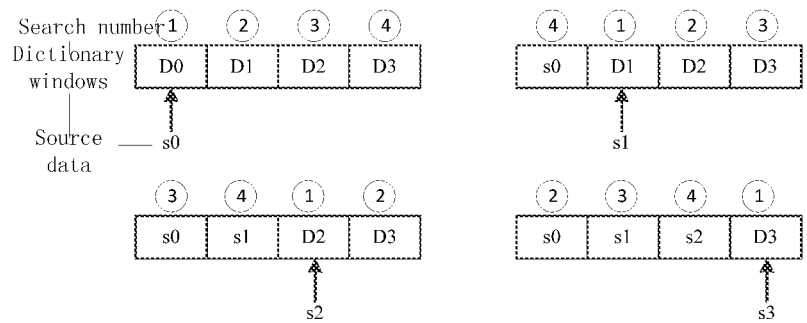
FIG. 6 is a schematic diagram of dictionary window update.

This compression process will be explained with reference to FIG. 6 as an example. The dictionary window contains 4 storage cells with the initialization content of D0, D1, D2 and D3, and the source data to be compressed of s0, s1, s2 and s3. While updating the dictionary, D0, D1, D2 and D3 are replaced with s0, s1, s2 and s3 from left to right in turn. And during the matching and searching process, data in buffer units 1, 2, 3 and 4 in the dictionary window is used as the matching and searching objects in turn.

The updating policy of the dictionary is that the dictionary does not slide, and elements in the dictionary are covered from left to right by source data, and at the same time, the starting location for searching is not started from 0 every time but incrementing +1 in turn. The number of periods taken for the dictionary to update is shorten from $2(N-1)+1$ to 1 and the power consumption is drastically reduced.

Figure 7:
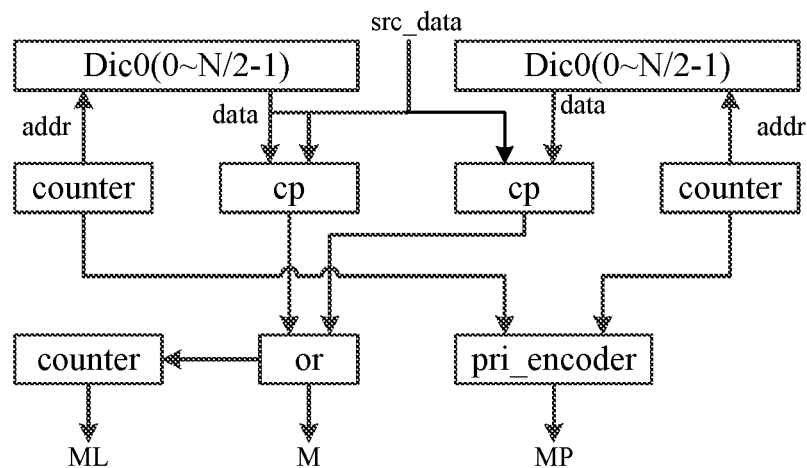
FIG. 7 is a structural diagram of dual-RAM parallel dictionary compression hardware.

When there is a high requirement on the compression ratio, the dictionary window may be segmented as shown in FIG. 7 in which the dictionary window is segmented into two in which parallel search may be realized.

In a traditional LZ dictionary compression hardware structure, only one source data may be compressed each time due to the data dependency. In the design of the present invention, four source data is read once. The four source data are searched in parallel to increase the compression speed. And the compression process is terminated at any time according to the matching condition.

Figure 8:
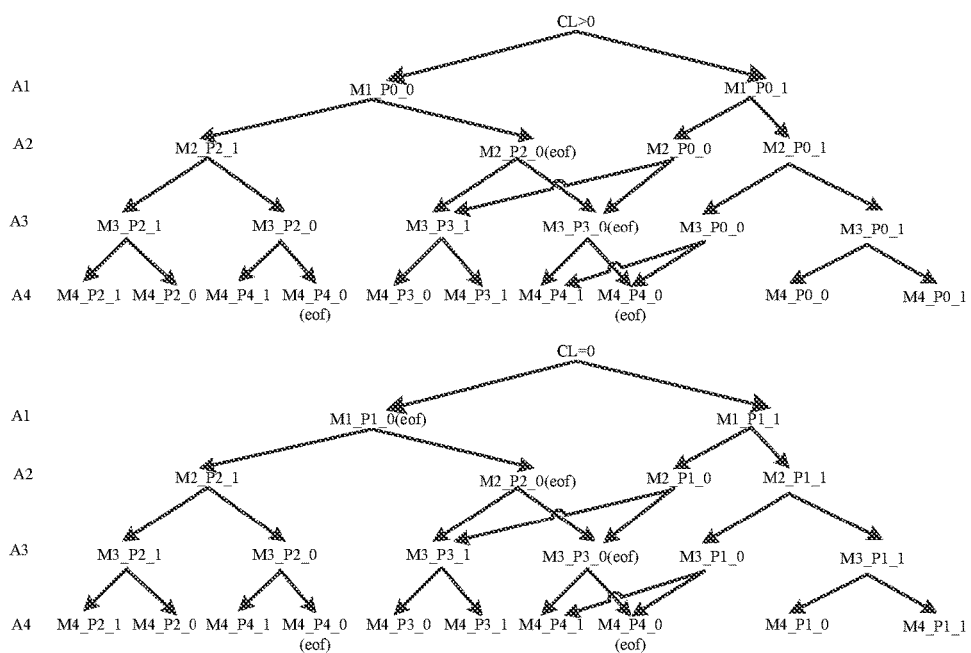
FIG. 8 is a distribution graph of parallel compression matching of multisource data.

As shown in FIG. 8, it is the step-by-step characteristic of the matching condition in the compression process.

In the figure, A1, A2, A3 and A4 represent four source data read one time, P0 represents an initial matching position, P1, P2, P3 and P4 represent the matching positions of the four source data in the dictionary window respectively, Mx_Py represents the matching result between the $x^{th}$ piece of source data and the $y^{th}$ matching position. For example, "M1_P0_1" indicates that the first source data matches the dictionary element at P0 position successfully, "M1_P0_0" indicates that the first source data fails to match the dictionary element at P0 position. "eof" indicates ending searching all elements in the dictionary.

Encoding Process (1) P0 is matched to obtain values of M1_P0, M2_P0, M3_P0, M4_P0 in turn;

(2) A1, A2, A3 and A4 are all searched in parallel. In this process, values of M1_P1, M2_P2, M3_P3, M1_P4 will be obtained. What is shown in the figure is the condition for ending searching A1, A2, A3 and A4. When the searching for the four source data are all ended, search for the current batch of source data is ended. When M1_P1 is pulled high, in the 3 periods thereafter, values of M2 P1, M3_P1 and M4_P1 are obtained in turn; and when M2_P2 is pulled high, in the 2 periods thereafter, values of M3_P2 and M4_P2 are obtained in turn; and when M3_P3 is pulled high, in the 1 period thereafter, the value of M4_P3 is obtained.

Key of the Encoding:

(1) When the encoding is over (as shown in FIG. 8, encoding of A1, A2, A3 and A4 are all ended);

(2) CL output, CP output and code word output (divided into four stages, A1, A2, A3 and A4 for processing)

The output values are practical matching conditions of A1, A2, A3, A4 determined according to separate match values in the full searching process after all the full searchings are ended.

A1: Matching P0, matching P1, not matching

A2: Matching P0, matching P1, matching P2, not matching

A3: Matching P0, matching P1, matching P2, matching P3, not matching

A4: Matching P0, matching P1, matching P2, matching P3, matching P4, not matching There are the following several matching conditions for An:

a. Matching Pn−1 (CLn−1>0): —CL=CL+1, CP not changed
b. not matching Pn−1 (CLn−1<0); —Outputting code word, CL cleared
c. Matching Pn (CLn−1=0); —CL=CL+1, CP value loaded
d. not matching Pn (CLn−1=0): —Outputting code word, CL cleared What have been described above are only preferred embodiments of the present invention, rather than limiting the present invention in any form. Any simple variations, equivalences and modifications made to the above embodiments according to the technical nature of the present invention within the spirit and principle of the present invention still fall within the scope of the present invention.

Though the principle of the present invention has been described in detail above with respect to preferred embodiments of the present invention, those skilled in the art should understand that the above-mentioned embodiments are only explanations of schematic implementations of the present invention rather than limitation to the scope contained in the present invention. Specific details in embodiments do not limit the scope of the present invention. Without departing from the spirit and scope of the present invention, any obvious variations such as equivalent transformations, simple substitutions based on the technical proposal of the present invention fall within the scope of the present invention.

The invention claimed is:

1. A program counter compression method, wherein said compression method comprises the steps of:

step (1), acquiring execution condition of instructions sent by a processor and classifying and screening the instructions based on the execution condition of the instructions;

step (2), executing differential operation on the values of a program counter of objective type of instructions and stall periods based on a result of classifying and screening, then splicing obtained difference values to obtain respective valid data segment;

step (3), dictionary encoding the obtained valid data segments of difference slices obtained in step (2);

wherein, the program counter compression method classifies instructions into (1) sequential execution, (2) skip and (3) stall, said step (1) comprises:

step (1.1), acquiring a program counter value corresponding to each instruction;

step (1.2), calculating a difference value PC_diff=PC−PC_pre of program counter values of any two successive instructions, wherein PC denotes the value of program counter of the current period, PC_pre denotes the value of program counter of the last period;

step (1.3), classifying the instructions based on the difference value PC_diff of the program counter values of any two successive instructions, (a) If PC_diff=1, classifying the current instruction as sequence instruction and not recording the instruction;

(b) If PC_diff=0: classifying the current instruction as stall instruction and recording the program counter value corresponding to the stall instruction and stalled periods;

(c) If PC_diff≠0 and PC_diff≠1, classifying the current instruction as jump instruction, recording a branch address corresponding to the instruction and a program counter value corresponding to a destination address, said step (2) comprises:

step (2.1), differentiating the program counter values of the recorded stall instruction and jump instruction and the number of periods for which respective instruction persists, so as to obtain respective difference values;

step (2.2), dividing the difference values into several data segments according to the sequence of data bits with each data segment having the same number of data bits;

step (2.3), determining from left to right whether data bits in each data segment are all 0 or all 1; and step (2.4), if data bits in a data segment are all 0 or all 1, discarding the data segment, or else, if data bits in the data segment are not all 0 or all 1, transferring the data segment and its lower data segments to step (3).

2. The program counter compression method of claim 1, wherein, said step (3) comprises:

step (3.1), receiving data segments transferring in step (2), wherein each data segment contains several source data;

step (3.2), constructing a dictionary in a memory, the dictionary comprising several elements; and step (3.3), searching each of the source data in each element of the dictionary, if the current source data matches an element in the dictionary, recording the position of the element in the dictionary and updating the dictionary with the source data after recording a position of the element in the dictionary; if all elements are not matched, updating the dictionary with the source data directly, wherein while updating the dictionary, the dictionary does not slide, and elements in the dictionary are covered from left to right with the source data and the search starting position is incremented by +1 after each updating.

3. The program counter compression method of claim 2, wherein, said step (3) further comprises:

segmenting a dictionary window; reading N data sources one time, with N being a positive integer greater than or equal to 2, for each data source, searching for one data source is started for each program period, and the search starting location for each data source is incremented by +1 as compated to the last data source; so as to obtain a matched search result for each data source, and determining a practical matching result based on a matching result for all the N data sources.

4. A program counter compression device, wherein, said compression device comprises: an instruction classification module, a data differential slicing module and a dictionary encoding module, said instruction classification module is configured to acquire execution condition of instructions sent by a processor and classifying and screening said instructions based on said execution condition of the instructions;

said data differential slicing module is configured to execute differential operation on values of a program counter of object type of instructions and stall periods to execute differential operation based on a result of classifying and screening and splicing the obtained differential values; and said dictionary encoding module is configured to construct dictionary codes based on a RAM with a depth of N and execute Lampel-Ziv dictionary encoding on valid differential sliced data segments.

5. The program counter compression device of claim 4, wherein, said compression device is configured to carry out a program counter compression method comprising the steps of:

step (1), acquiring execution condition of instructions sent by a processor and classifying and screening the instructions based on the execution condition of the instructions:

step (2), executing differential operation on the values of a program counter of objective type of instructions and stall periods based on a result of classifying and screening, then splicing obtained difference values to obtain respective valid data segment:

step (3), dictionary encoding the obtained valid data segments of difference slices obtained in step (2):

wherein, the program counter compression method classifies instructions into (1) sequential execution, (2) skip and (3) stall, said step (1) comprises:

step (1.1), acquiring a program counter value corresponding to each instruction:

step (1.2), calculating a difference value PC_diff=PC-PC_pre of program counter values of any two successive instructions, wherein PC denotes the value of program counter of the current period, PC_pre denotes the value of program counter of the last period;

step (1.3), classifying the instructions based on the difference value PC_diff of the program counter values of any two successive instructions, (a) If PC_diff=1, classifying the current instruction as sequence instruction and not recording the instruction:

(b) If PC_diff=0: classifying the current instruction as stall instruction and recording the program counter value corresponding to the stall instruction and stalled periods:

(c) If PC_diff≠0 and PC_diff≠1, classifying the current instruction as jump instruction, recording a branch address corresponding to the instruction and a program counter value corresponding to a destination address, said step (2) comprises:

step (2.1), differentiating the program counter values of the recorded stall instruction and jump instruction and the number of periods for which respective instruction persists, so as to obtain respective difference values:

step (2.2), dividing the difference values into several data segments according to the sequence of data bits with each data segment having the same number of data bits;

step (2.3), determining from left to right whether data bits in each data segment are all 0 or all 1; and step (2.4), if data bits in a data segment are all 0 or all 1, discarding the data segment, or else, if data bits in the data segment are not all 0 or all 1, transferring the data segment and its lower data segments to step (3).

* * * * *